United States Patent
Cameron et al.

(10) Patent No.: US 7,297,616 B2
(45) Date of Patent: Nov. 20, 2007

(54) METHODS, PHOTORESISTS AND SUBSTRATES FOR ION-IMPLANT LITHOGRAPHY

(75) Inventors: James F. Cameron, Cambridge, MA (US); Peter Trefonas, III, Medway, MA (US); George G. Barclay, Jefferson, MA (US); Jin Wuk Sung, Worcester, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 99 days.

(21) Appl. No.: 10/822,225

(22) Filed: Apr. 9, 2004

(65) Prior Publication Data

US 2005/0032373 A1    Feb. 10, 2005

Related U.S. Application Data

(60) Provisional application No. 60/462,409, filed on Apr. 9, 2003.

(51) Int. Cl.
*H01L 21/425* (2006.01)
(52) U.S. Cl. .................. 438/514; 257/21.021
(58) Field of Classification Search ............. 438/514, 438/530; 430/326, 322
See application file for complete search history.

(56) References Cited

U.S. PATENT DOCUMENTS

| | | | |
|---|---|---|---|
| 4,767,721 A | 8/1988 | Liao et al. | |
| 5,858,623 A | 1/1999 | Yu et al. | |
| 5,861,231 A | 1/1999 | Barclay et al. | |
| 6,042,997 A | 3/2000 | Barclay et al. | |
| 6,136,501 A | 10/2000 | Trefonas, III et al. | |
| RE37,179 E | 5/2001 | Yamachika et al. | |
| 6,352,818 B1 | 3/2002 | Hsieh | |
| 6,369,874 B1 | 4/2002 | del Puerto | |
| 6,458,430 B1 | 10/2002 | Bernstein et al. | |
| 6,492,087 B1 | 12/2002 | Brainard | |
| 6,800,422 B2 | 10/2004 | Thackeray et al. | |
| 6,841,338 B2 | 1/2005 | Lee et al. | |
| 6,866,986 B2 | 3/2005 | Chun et al. | |
| 2002/0151156 A1 | 10/2002 | Hallock et al. | |
| 2003/0027086 A1 | 2/2003 | Thackeray et al. | |
| 2003/0232274 A1 | 12/2003 | Barclay et al. | |
| 2005/0019705 A1* | 1/2005 | Thackeray et al. | ......... 430/326 |

* cited by examiner

*Primary Examiner*—Bradley K. Smith
(74) *Attorney, Agent, or Firm*—Peter F. Corless; Darryl P. Frickey; Edwards Angell Palmer Dodge LLP

(57) ABSTRACT

New photoresists are provided that can be applied and imaged with reduced undesired outgassing and/or as thick coating layers. Preferred resists of the invention are chemically-amplified positive-acting resists that contain photoactive and resin components.

6 Claims, No Drawings

METHODS, PHOTORESISTS AND SUBSTRATES FOR ION-IMPLANT LITHOGRAPHY

The present application claims the benefit of U.S. provisional application No. 60/462,409, filed Apr. 9, 2003, which is incorporated herein by reference in its entirety.

BACKGROUND OF THE INVENTION

1. Field of the Invention

The invention relates to new photoresists, particularly photoresists that can be applied and imaged with reduced undesired outgassing and/or as thick coating layers. Preferred resists of the invention are chemically-amplified positive-acting resists that contain one or more photoacid generator compounds and a resin component.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate. A photoresist can be either positive-acting or negative-acting. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

Ion implantation techniques have been employed for doping semiconductor wafers. By this approach, an ion beam implanter generates an ion beam within an evacuated (low pressure) chamber, and the ions are directed and "implanted" to the wafer.

Significant problems arise however with current ion implantation methods. For instance, imaged coatings of current photoresists that serve as masking layers often exhibit significant "outgassing" of volatile materials as a result of the ion bombardment and low pressure processing conditions. Such outgassing will compromise processing conditions, including undesired modulating of the operating pressure of the reaction vessel, deposition of organic materials on the optical equipment, and the like.

Certain efforts have been made to address such outgassing. For example, U.S. Pat. No. 5,858,623 reports ion-pretreatmnent of a photoresist layer. That approach adds more processing time and costs and would not be applicable to many resist systems. U.S. Pat. No. 6,458,430 also reports an ion-pretreatment of a photoresist layer to attempt to minimize undesired outgassing during subsequent ion implantation.

U.S. Pat. No. 6,369,874 reports a so-called outgassing mitigation apparatus in which to conduct implantation processes. That approach also adds costs and necessitates use of additional equipment.

In certain processes for semiconductor wafer manufacture, use of a photoresist as a thick coating layer (e.g. at a dried (post soft-bake) thickness of 1 or 2 microns or greater is desirable. For instance, thick film photoresists are used for the formation of semiconductor bumps (protruded electrodes) and for rewiring. Highly useful thick film photoresists are disclosed in U.S. pat. application Ser. No. 2003/0027086 to Thackeray et al.

Many reported thick film compositions however are inadequate for current needs. For example, current compositions are designed for longer wavelength imaging such as 365 nm or other wavelengths in excess of 300 nm such as used with a quinone diazide photoactive component, rather than shorter wavelength imaging such as sub-300 nm particularly 248 nm, which is required to higher performance applications. See U.S. pat. applications Ser. Nos. 2003/0059706 and 2003/0039931.

It thus would be desirable to have new photoresists that could provide reduced outgassing, particularly under ion implantation processes. It also would be desirable to have new photoresists that could be effectively processed as thick films.

SUMMARY OF THE INVENTION

We have now found new photoresist compositions and methods that can provide reduced outgassing under vigorous processing conditions, such as ion implantation processing.

Additionally, preferred photoresists of the invention can be effectively applied as a thick coating film, e.g. at dried layer (post soft-bake) thicknesses of in excess of 1 micron, preferably in excess of about 1.5, 2, 3, 4 or even 5 microns.

Resists of the invention can be imaged at short wavelengths, including sub-300 nm such as 248 nm, to provide highly resolved thick layer relief images.

More particularly, in a first aspect, chemically-amplified (deblocking) positive-acting photoresists are provided that generate a reduced molar amount of volatile organic material (cleavage product) upon a photoacid-induced deblocking reaction.

In one approach, a blocked acidic moiety, e.g. an acid blocked as an ester or alcohol blocked as an acetal, is spaced by a linker from the polymer backbone. It has been found that such spacing increases the acidity of the deblocked group. More particularly, the deblocking group may be linked by a chain of 1, 2, 3, 4, 5, 6 or more atoms such as carbon or a hetero atom (N, O or S) to a group such as polymerized styrene or vinylphenol that forms the polymer backbone.

By thus increasing the acidity of photoacid-labile groups, the relative amount of the photoacid-labile groups can be decreased in the resin without compromising contrast levels. For example, a resin can be employed that comprises units that contain photoacid labile groups in an amount of 20 mole percent or less, based on total units of the resin, or even lower levels such as 15, 12, 10, 8, or 5 or less mole percent of units that contain photoacid labile groups, based on total units of the resin.

In general, preferred deblocking resins that are used in positive resists of the invention contain less than about 12, 10, 8, 7, or 5 or less mole percent of units that contain photoacid labile groups, based on total units of the resin.

Such a reduced amount of photoacid-labile groups may be provided by any of several approaches. For instance, a higher order polymer may be employed, i.e. a terpolymer (three distinct repeat units), tetrapolymer (four distinct repeat units) or pentapolymer (five distinct repeat units), or other polymer that has more than one or two distinct repeat units.

Preferred polymers of this type may comprise a repeat unit that does not comprise a photoacid-labile group, or that does not comprise other groups that promote aqueous base developer solubility such as hydroxy, carboxy, sulfonamide and the like. Thay is, such groups are generally intert lithographically and do react with acid, exposure radiation or thermally (generally less than 170° C.) under typical lithographic processing (pre-exposure bake, exposure, post-exposure bake and development steps). For instance, preferred inert repeat units of this type include phenyl; naphthyl; cyclohexyl; carbon alicyclic such as cyclic groups having 3 to about 20 carbon atoms e.g. adamantyl, norbornyl, fenchyl, cyclohexyl, cycopentyl, and the like; acyclic alkyl such as $C_{1-20}$alkyl e.g. methyl, ethyl, propyl, butyl, pentyl, hexyl and the like; alkoxy and other heteroalkyl such as $C_{1-20}$heteroalkyl e.g. methoxy, ethylthio, butoxy, and the like, all of which may be optionally substituted with non-volatile or non-reactive groups such as halogen, $C_{1-12}$alkyl, $C_{1-12}$alkoxy and the like.

Use of such relatively inert polymer groups can facilitate a lowered amount of deblocking groups, particularly by enabling balancing of dissolution properties provided by photoacid-labile groups and other non-deblocking groups that enhance dissolution in aqueous base such as phenol, fluorinated alcohol and the like.

In another approach of this aspect of the invention, deblocking groups are employed that remain covalently linked to the polymer structure after a photoacid-induced deblocking reaction. Such deblocking groups may have multiple covalent linkages to the polymer prior to deblocking, e.g. the photoacid-acid labile may be a cyclic group linked to the polymer, where the photoacid-induced deblocking reaction provides an acidic group through (or by) ring opening, without liberating any volatile species. For example, a —COOH may be provided such as by opening of a lactone; —OH such as by cleavage of a cyclic ether; etc.

In another approach, a photoresist composition may be employed that comprise one or more resist components that are covalently linked by a group that can be cleaved by exposure and/or photogenerated acid. For example, a resin component can be employed wherein the resin is crosslinked by an acid-labile moiety that provides a covalently linked acidic moiety upon photoinduced cleavage, e.g. a resin system linked as follows: resin—$C_6H_4$—$C(CH_3)_2$—O (C=O)-resin, which can be provided by reaction of the resin with a monomer of the following formula: $CH_2$=CH—$C_6H_4$—$C(CH_3)_2$—O(C=O)—CH=$CH_2$.

In a related aspect, a photoacid generator may be covalently linked to another resist component so that generation of volatile species are minimized upon photoactivation of the acid generator. For instance, the photoacid generator compound may be covalently linked to a resist resin.

In a yet another approach of this aspect of the invention, photoresists are provided that contain a component with photoacid-labile groups, wherein the photoacid-labile group generates a relatively large cleavage product, particularly a cleavage product that comprises 5 or more carbon atoms and/or a single or multiple ring structure. Preferred leaving groups will have a molecular volume of at least about 125 cubic angstroms ($Å^3$). Preferred are groups that comprise an acyclic moiety with multiple branches or alicyclic hydrocarbon groups that comprise one or preferably has two or more fused or bridged rings, such as optionally substituted fenchyl groups, particularly ethyl fenchyl; optionally substituted alkyl adamantyl, particularly a methyladamantyl leaving group (where the ester oxygen is linked to the tertiary carbon of the methyladamantyl moiety); optionally substituted tricyclo decanyl; optionally substituted pinanyl; and the like.

Such group also can provide reduced outgassing, including by a "shielding" effect where the relatively bulky cleavage products are retained within the polymer matrix.

In an additional aspect of the invention, a photoresist coating layer may be treated (but not by ion bombardment) in order to minimize undesired outgassing of resist material, e.g. as may be possible during subsequent ion implantation processing. In particular, a resist may comprise an outgassing-promoting substance such as acid source (e.g. an acid or acid generator compound such as a photoacid generator or thermal acid generator), and the resist is treated (e.g. thermally or by radiation such as by a flood exposure) after development to remove any volatile groups prior to ion implantation processing, or other processing. Preferably, an acid generator is employed, especially a thermal acid generator compound that will generate acid during a post-development thermal treatment but not during prior lithographic processing.

In another aspect, an imaged photoresist coating layer may be coated in order to minimize undesired outgassing of resist material, e.g. as may be possible during subsequent ion implantation processing. For example, the imaged coating (typically the resist layer also has been developed) may be treated to provide a outer coating layer to encapsulate materials that could outgas during subsequent ion implantation processing. A preferred approach is treatment of the developed resist image with a material that will preferably react and/or adhere to the resist image rather than the substrate areas bared upon development. For instance, the developed resist image can be treated with a solyl reagent such as trimethylsilyl chloride.

In a yet further aspect of the invention, particularly to apply a thick photoresist coating layer such as a dried layer thickness in excess of 1 or 2 microns, one or more components of the resist can be modified to provide enhanced transparency to exposure radiation.

In particular, in this aspect, preferred photoacid generator compounds will not comprises any aromatic moieties.

Additionally, a resist resin may be employed that comprises repeat units of phenolic or other aromatic groups, but also contain repeat units that are free of any aromatic substitution such as may be provided by polymerization or vinylcyclohexane or vinylcyclohexanol or other alicyclic group, or by polymerization of an acrylate group. Preferably, at least about 10 mole percent of the total polymer repeat units will be free of any aromatic substitution, more preferably at least about 20, 30, 40, 50, 60 or even 70 mole percent of total repeat units will be free of any aromatic substitution.

In a yet further aspect of the invention, particularly to apply a thick photoresist coating layer such as a dried layer thickness in excess of 1 or 2 microns, a photoresist composition may be formulated with one or more lower viscosity solvents. More particularly, preferred are linear ketone solvents such as hexanone and heptanone as well as cyclic ketones such as cyclohexanone and cycloheptanone and esters such as a lactate e.g. methyl lactate and ethyl lactate.

The invention further comprises articles of manufacture comprising substrates such as a microelectronic wafer having coated thereon the photoresists and relief images of the invention. The invention also includes methods to manufacture microelectronic wafers and other articles.

Additionally, as discussed, in a preferred aspect, the invention provided informed ion implantation processing. Such a process may include implanting dopant ions (e.g. Group III and/or V ions such as boron, arsenic, phosphorus and the like) into a surface of a substrate (e.g. semiconductor wafer) having thereon an organic photoresist as disclosed which serves as a mask. The resist-masked substrate may be placed in a reaction chamber which can provide reduced pressure and a plasma of ions from an ionizable source. Those ions include dopants as mentioned which are electrically active when implanted into the substrate. Voltages may be applied in the reaction chamber (such as through electrically conductive chamber walls) to selectively implant the dopant ions.

Other aspects of the invention are disclosed infra.

DETAILED DESCRIPTION OF THE INVENTION

As discussed above, we have now found new photoresist compositions and methods that can provide reduced outgassing under vigorous processing conditions.

Additionally, preferred photoresists of the invention can be effectively applied a thick coating film, e.g. at dried layer (post soft-bake, pre-exposure measurement) thicknesses of in excess of 1 micron, more typically a dried layer thickness of about 1.5, 2, 3, 4, 5 microns or more, or even 6 or 7 microns or more. Resist layers can be employed that have very significant dried layer thicknesses. For at least some applications, it may not be necessary to apply and process resist layers that are in excess of about 10 or more microns dry layer thickness. As referred to herein, dry layer thickness is the thickness of a liquid photoresist composition that has been spin-coated onto a substrate (e.g., silicon microelectronic wafer) and dried by exposure to 110° C. for 60 seconds.

Resists can be imaged at short wavelengths in accordance with the invention, including sub-300 nm such as 248 nm or 193 nm, to provide highly resolved thick layer relief images.

More particularly, in preferred aspects, the invention includes methods for providing an ion-implanted semiconductor substrate, which comprise providing a semiconductor substrate having coated thereon a relief image of chemically-amplified positive-acting photoresist composition, wherein the photoresist comprises a resin that comprises, prior to photoactivation, photoacid-labile moieties that are spaced by at least 1 atom from the resin backbone; and applying ions (particularly high energy e.g. >20 eV, reduced pressure) implanting of dopant ions such as argon, boron, boron fluoride, arsenic, phosphorus and/or nitrogen ions) to the substrate. More preferable, the the photoacid-labile moieties are spaced by at least 2 atoms from the resin backbone, or even at least 3, 4, 5 or 6 atoms from the resin backbone.

In another preferred aspect, the invention provides methods for providing an ion-implanted semiconductor substrate comprising providing a semiconductor substrate having coated thereon a relief image of chemically-amplified positive-acting photoresist composition, wherein the photoresist comprises, prior to photoactivation, a resin that comprises units that contain photoacid-labile moieties in an amount of 12 mole percent or less, based on total units of the resin; and applying ions (particularly high energy e.g. >20 eV, reduced pressure) implanting of dopant ions such as argon, boron, boron fluoride, arsenic, phosphorus and/or nitrogen ions) to the substrate. Preferably, the resin comprises units that contain photoacid-labile moieties in an amount of 10 mole percent or less, based on total units of the resin, or even lower such photoacid-labile moieties in an amount of 8, 6 or 5 mole percent or less, based on total units of the resin.

In another preferred aspect, the invention provides methods for providing an ion-implanted semiconductor substrate comprising providing a semiconductor substrate having coated thereon a relief image of chemically-amplified positive-acting photoresist composition, wherein the photoresist comprises, prior to photoactivation, a resin that comprises units that contain photoacid-labile moieties that have multiple covalent linkages to the resin prior to a photoacid-deblocking reaction; and applying ions (particularly high energy e.g. >20 eV, reduced pressure) implanting of dopant ions such as argon, boron, boron fluoride, arsenic, phosphorus and/or nitrogen ions) to the substrate.

In another preferred aspect, methods are provided for providing an ion-implanted semiconductor substrate comprising providing a semiconductor substrate having coated thereon a relief image of chemically-amplified positive-acting photoresist composition, wherein the photoresist comprises, prior to photoactivation, one or more components that are covalently linked by a group that can be cleaved by exposure and/or photogenerated acid; and applying ions (particularly high energy e.g. >20 eV, reduced pressure) implanting of dopant ions such as argon, boron, boron fluoride, arsenic, phosphorus and/or nitrogen ions)to the substrate. In such methods, preferably, the photoresist comprises a resin that is crosslinked by a photoacid-labile linker.

In another preferred aspect, method are provided for providing an ion-implanted semiconductor substrate comprising providing a semiconductor substrate having coated thereon a relief image of chemically-amplified positive-acting photoresist composition, wherein the photoresist comprises, prior to photoactivation, photoacid-labile groups that generate upon photoactivation a cleavage product that comprises 5 or more carbon atoms and/or a single or multiple ring structure; and applying ions (particularly high energy e.g. >20 eV, reduced pressure) implanting of dopant ions such as argon, boron, boron fluoride, arsenic, phosphorus and/or nitrogen ions) to the substrate.

In yet another preferred aspect, methods are provided for providing an ion-implanted semiconductor substrate comprising providing a semiconductor substrate having coated thereon a relief image of chemically-amplified positive-acting photoresist composition, treating the photoresist composition image thermally or with radiation to remove volatile materials of the photoresist composition; and thereafter applying ions (particularly high energy e.g. >20 eV, reduced pressure) implanting of dopant ions such as argon, boron, boron fluoride, arsenic, phosphorus and/or nitrogen ions) to the substrate. In such methods the photoresist composition relief image is suitably thermally treated (e.g. in excess of 130° C., 140° C., 150° C., 160° C. or 180° C. or more) to remove volatile materials. Alternatively, rather than thermal treatment, a photoresist image may be treated with activating radiation (e.g. sub-300 nm radiation such as 248 nm or 193 nm) to remove volatile materials. In such methods, the photoresist composition may suitably contain an acid or thermal acid generator to facilitate thermal-induced or radiation-induced liberation of volatile materials.

In a yet further preferred aspect of the invention, methods are provided for providing an ion-implanted semiconductor substrate comprising providing a semiconductor substrate having coated thereon a relief image of chemically-amplified positive-acting photoresist composition, treating the photoresist composition image to provide a coating on over the photoresist relief image; and thereafter applying ions (particularly high energy e.g. >20 eV, reduced pressure) implanting of dopant ions such as argon, boron, boron fluoride, arsenic, phosphorus and/or nitrogen ions) to the substrate. Preferably, the photoresist composition image is treated with a Si-containing material to provide the coating.

Coated substrates also are provided, including coated substrates that comprise a semiconductor wafer having coated thereon a relief image of chemically-amplified positive-acting photoresist composition that comprises a resin that comprises, prior to photoactivation, photoacid-labile moieties that are spaced by at least 1 atom from the resin backbone; and the wafer having applied dopant ions. The dopant ions preferably will have been implanted under high energy (e.g. >20 eV, reduced pressure) conditions and the ions may be e.g. argon, boron, boron fluoride, arsenic, phosphorus and/or nitrogen ions. The photoacid-labile moieties also may be further spaced from the resin backbone, e.g. by at least 2, 3, 4, 5 or 6 atoms from the resin backbone.

In another aspect, coated substrates are provided that comprise a semiconductor wafer having coated thereon a relief image of chemically-amplified positive-acting photoresist composition that comprises, prior to photoactivation, a resin that comprises units that contain photoacid-labile moieties in an amount of 12 mole percent or less, based on total units of the resin; and the wafer having applied dopant ions. The dopant ions preferably will have been implanted under high energy (e.g. >20 eV, reduced pressure) conditions and the ions may be e.g. argon, boron, boron fluoride, arsenic, phosphorus and/or nitrogen ions. The resin also preferably may contain lower amounts of photoacid-labile moieties, e.g. photoacid-labile groups in an amount of 10, 9, 8, 7, 6, 5 or 4 mole percent or less, based on total units of the resin.

In yet another aspect, coated substrates are provided that comprise a semiconductor wafer having coated thereon a relief image of chemically-amplified positive-acting photoresist composition that comprises, prior to photoactivation, a resin that comprises units that contain photoacid-labile moieties that have multiple covalent linkages to the resin prior to a photoacid-deblocking reaction; and the wafer having applied dopant ions. The dopant ions preferably will have been implanted under high energy (e.g. >20 eV, reduced pressure) conditions and the ions may be e.g. argon, boron, boron fluoride, arsenic, phosphorus and/or nitrogen ions.

In a further aspect, coated substrates are provided that comprise a semiconductor wafer having. coated thereon a relief image of chemically-amplified positive-acting photoresist composition that comprises, prior to photoactivation, one or more components that are covalently linked by a group that can be cleaved by exposure and/or photogenerated acid; and the wafer having applied dopant ions. The dopant ions preferably will have been implanted under high energy (e.g. >20 eV, reduced pressure) conditions and the ions may be e.g. argon, boron, boron fluoride, arsenic, phosphorus and/or nitrogen ions. In this aspect, preferably, the photoresist comprises a resin that is crosslinked by a photoacid-labile linker.

In a yet further aspect, coated substrates are provided that comprise a semiconductor wafer having coated thereon a relief image of chemically-amplified positive-acting photoresist composition that comprises, prior to photoactivation, photoacid-labile groups that generate upon photoactivation a cleavage product that comprises 5 or more carbon atoms and/or a single or multiple ring structure; and the wafer having applied dopant ions. The dopant ions preferably will have been implanted under high energy (e.g. >20 eV, reduced pressure) conditions and the ions may be e.g. argon, boron, boron fluoride, arsenic, phosphorus and/or nitrogen ions.

In another aspect, coated substrates are provided that comprise a semiconductor wafer having coated thereon a relief image of chemically-amplified positive-acting photoresist composition that is coated; and the wafer having applied dopant ions. The dopant ions preferably will have been implanted under high energy (e.g. >20 eV, reduced pressure) conditions and the ions may be e.g. argon, boron, boron fluoride, arsenic, phosphorus and/or nitrogen ions. Suitably, the coating over the photoresist may comprise Si.

In such methods and coated substrates, preferably the dried layer thickness of the applied photoresist coating is least 2 microns, or even more preferably at least 3, 4 or 5 microns. Preferred dopant ions include boron, arsenic and/or phosphorus.

Preferred photoresists of the invention contain a resin or other component with aromatic functionality. A variety of polymers may be employed as the resin component of a resist of the invention. Preferred resins are phenolic polymers that contain one or more deblocking groups, such as photoacid-labile ester groups or acetal groups. Photoacid-labile ester or acetal groups may be grafted onto a preformed phenolic polymer, or a vinylphenol may be co-polymerized with other monomers including those that contain a photoacid-labile moiety such as an alkyl acrylate (which includes substituted acrylates such as methacrylates), such as provided by polymerization of methyladamantyl acrylate, methyladamantyl methacrylate and the like.

Poly(vinylphenols) and phenolic copolymers may be prepared, e.g., as disclosed in U.S. Pat. No. 4,439,516. Preferred phenolic copolymers are disclosed e.g. in U.S. Pat. Nos. 6,090,526; 6,077,643; 6,057,083; and 5,861,231. Additional suitable polymers are disclosed in and U.S. Pat. Nos. 4,968,581; 4,883,740; 4,810,613; 4,491,628; 5,258,257 and 5,492,793. Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

As discussed above, preferred resists will comprise a component particularly a resin that will have photoacid-labile groups spaced from the polymer backbone. Such "spaced" photoacid-labile groups can be readily provided, e.g. by grafting on an extended reactive ester to a phenolic hydroxy under basic (e.g. NaH or KOH) conditions for a time sufficient to complete the addition reaction. For instance, a reagent of the formula Br—$CH_2(CH_2)_n$—C(=O)OR may be reacted with a phenolic polymer to provide a leaving group of the corresponding formula Br—$CH_2$($CH_2)_n$—C(=O)OR covalently linked to the phenolic hydroxyl group, wherein in those formula n is suitably an integer of from 0 to 16, more typically n is an integer of from 0 to 6, and R is a group that provides a photoacid-labile group such as —$C(CH_3)_2$—$C(CH_3)_3$, methyladamantyl, ethylfenchyl and the like.

As discussed above, also preferred are photoresists that comprise a component typically a resin that comprises a photoacid-labile group that contains a relatively bulky photoacid-induced cleavage product. Suitable cleavage products will have a molecular volume of at least about 125 or about 130 Å³, more preferably a molecular volume of at least about 135, 140, 150, 155, 160, 165, 170, 175, 180, 185, 190, 195, or 200 Å³. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Some preferred bulky acyclic groups include the following and also are disclosed in U.S. Pat. No. 6,379,861 to Trefonas et al. of the Shipley Company; in the following structures the group Y is preferably hydrogen or methyl:

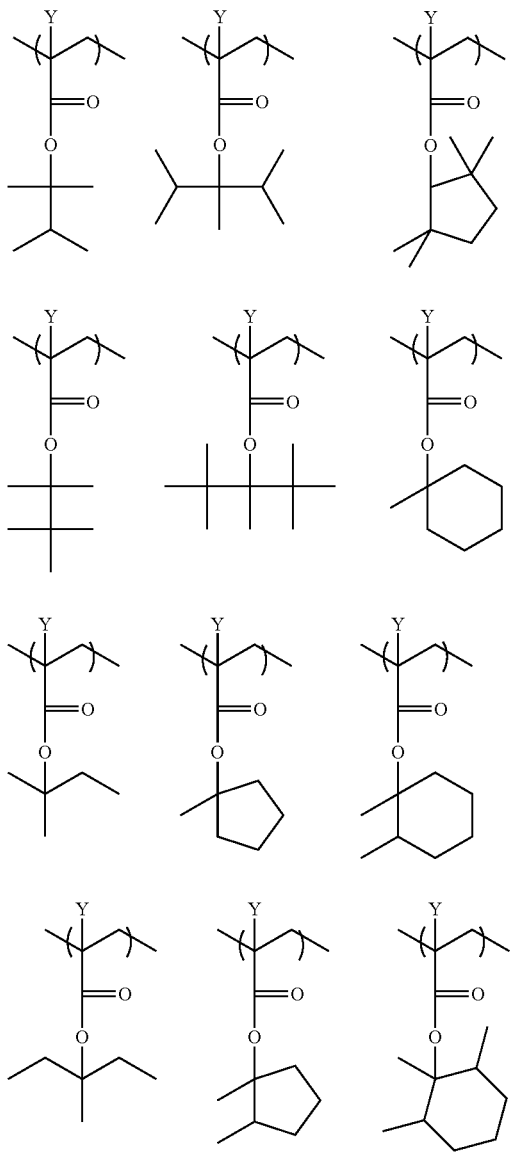

-continued

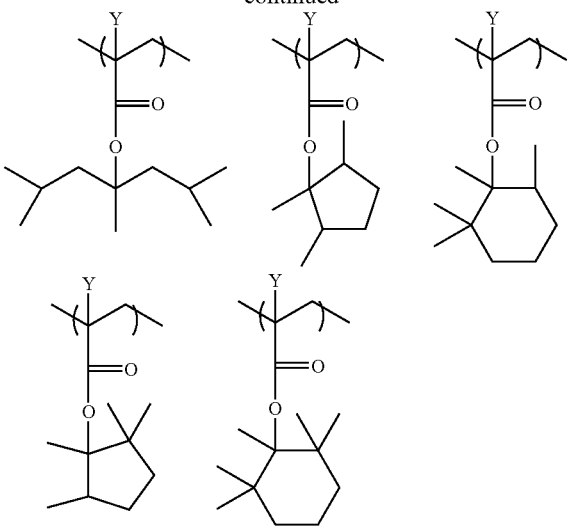

Some preferred alicyclic groups of acid labile esters of the invention are shown immediately below together with the ester oxygen linkage. The substituent R shown in the following structures is suitably $C_{1-8}$ alkyl, more typically $C_{1-6}$ alkyl such as methyl, ethyl, propyl, butyl, pentyl and the like.

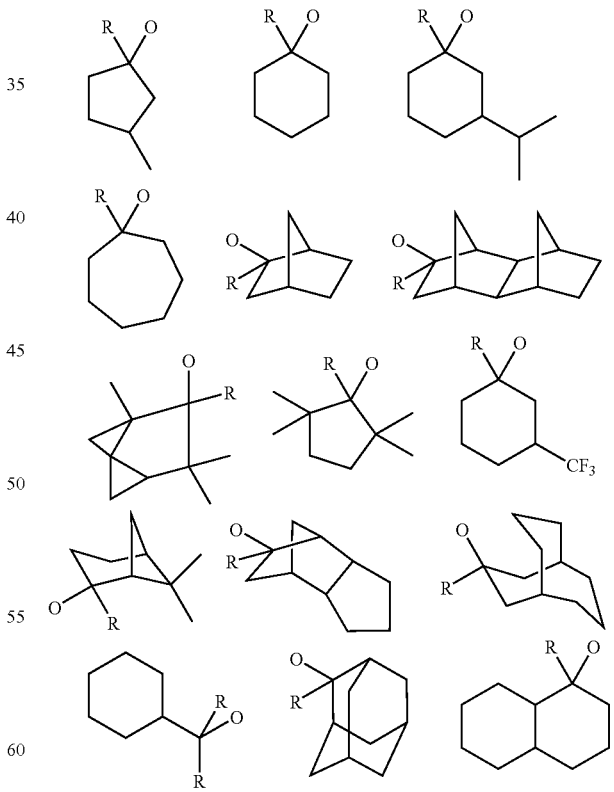

Some specifically preferred alicyclic groups of acid labile esters of the invention are shown immediately below together with the ester oxygen linkage, and with volumetric size values (Å³) listed to the right of the alicyclic group.

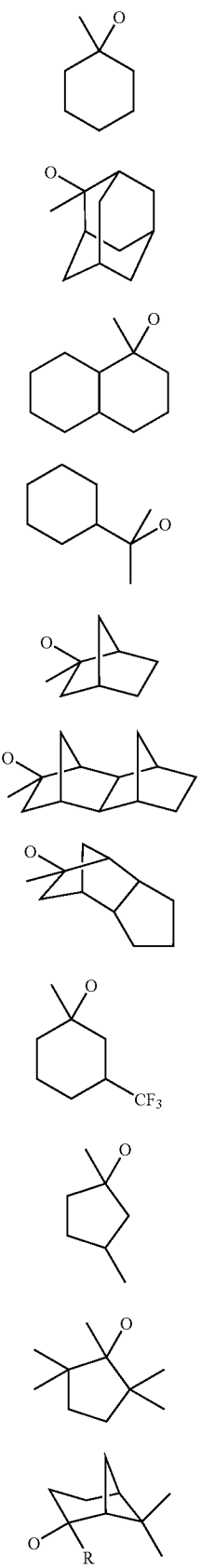

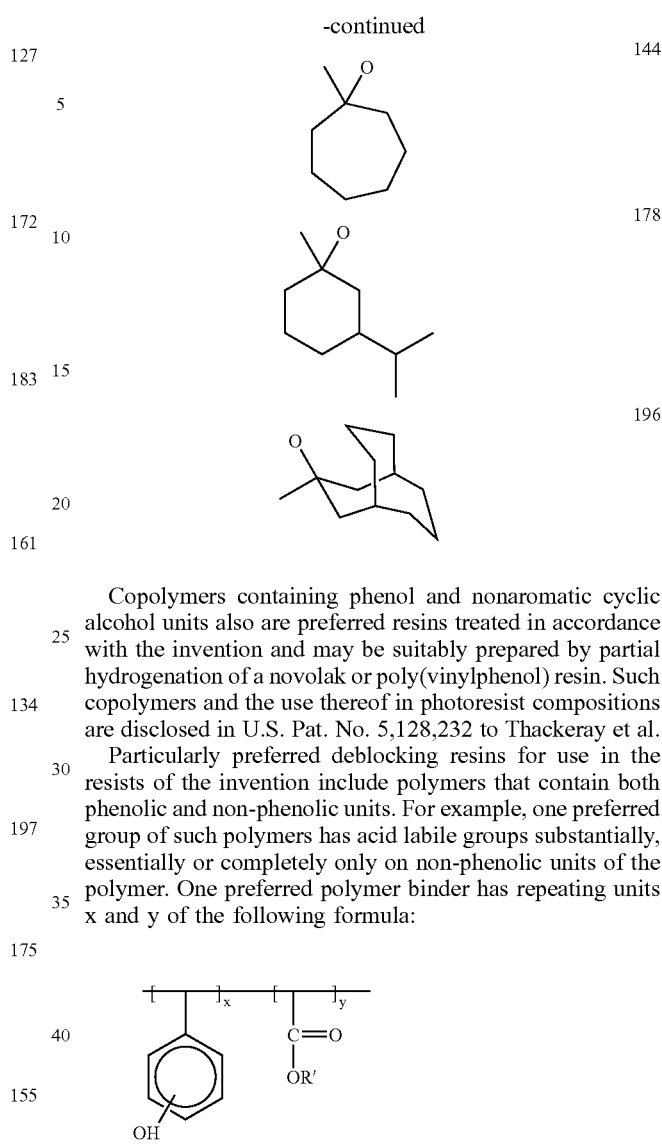

Copolymers containing phenol and nonaromatic cyclic alcohol units also are preferred resins treated in accordance with the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Particularly preferred deblocking resins for use in the resists of the invention include polymers that contain both phenolic and non-phenolic units. For example, one preferred group of such polymers has acid labile groups substantially, essentially or completely only on non-phenolic units of the polymer. One preferred polymer binder has repeating units x and y of the following formula:

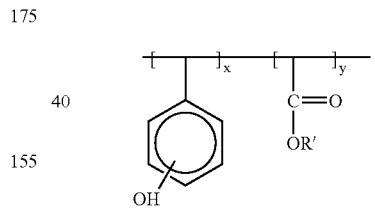

wherein the hydroxyl group be present at either the ortho, meta or para positions throughout the polymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the polymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, of the acrylate units serves as the acid labile groups of the resin and will undergo photoacid induced cleavage upon exposure of a coating layer of a photoresist containing the resin. Preferably the copolymer will have a Mw of from about 3,000 to about 50,000, more preferably about 10,000 to about 30,000 with a molecular weight distribution of about 3 or less, more preferably a molecular weight distribution of about 2 or less. Such copolymers also may be prepared by such free radical polymerization or other known procedures and suitably will have a Mw of from about 3,000 to about 50,000, and a molecular weight distribution of about 3 or less, more preferably a molecular weight distribution of about 2 or less.

Additional preferred deblocking resins have acid labile groups on both phenolic and non-phenolic units of the polymer. One preferred polymer binder has repeating units a, b and c of the following formula:

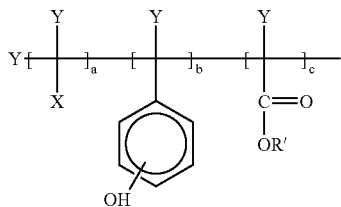

wherein R' group is a photoacid labile group as defined above for the other preferred polymer; X is another repeat unit which may or may not contain a photoacid labile group; and each Y is independently hydrogen or $C_{1-6}$ alkyl, preferably hydrogen or methyl. The values a, b and c designate the molar amount of the polymer units. Those polymer units may be regularly alternating in the polymer, or may be randomly interspersed through the polymer. Suitable X groups may be aliphatic or aromatic groups such as phenyl, cyclohexyl, adamantyl, isobornylacrylate, methacrylate, isobornymethacrylate, and the like. Such polymers may be formed in the same manner as described for the polymer above, and wherein the formed copolymer is reacted to provide the phenolic acid labile groups.

Additional preferred deblocking resins include at least three distinct repeating units of 1) units that contain acid-labile groups; 2) units that are free of reactive groups as well as hydroxy groups; and 3) aromatic or other units that contribute to aqueous developability of a photoresist containing the polymer as a resin binder. Particularly preferred deblocking polymers of this type correspond to the following formula:

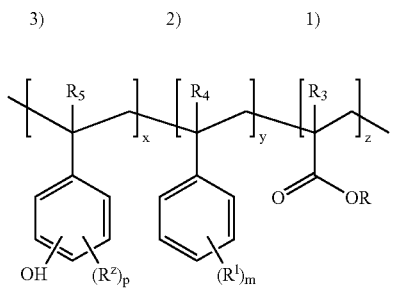

wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.

$R^1$ groups of units 2) of the above formula each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkynyl preferably having 2 to about 8 carbons, substituted or unsubstituted alkylthio preferably having 1 to about 8 carbons, cyano, nitro, etc.; and m is an integer of from 0 (where the phenyl ring is fully hydrogen-substituted) to 5, and preferably is 0, 1 or 2. Also, two $R^1$ groups on adjacent carbons may be taken together to form (with ring carbons to which they are attached) one, two or more fused aromatic or alicyclic rings having from 4 to about 8 ring members per ring.

For example, two $R^1$ groups can be taken together to form (together with the depicted phenyl) a naphthyl or acenaphthyl ring. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.

$R^2$ groups of units 3) of the above formula each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted sulfonyl preferably having 1 to about to about 8 carbon atoms such as mesyl ($CH_3SO_2O$—), substituted or unsubstituted alkyl esters such as those represented by RCOO— where R is preferably an alkyl group preferably having 1 to about 10 carbon atoms, substituted or unsubstituted alkenyl preferably having 2 to about 8 carbons, substituted or unsubstituted alkylthio preferably having 1 to about 8 carbons, cyano, nitro, etc.; and p is an integer of from 0 (where the phenyl ring has a single hydroxy substituent) to 4, and preferably is 0, 1 or 2. Also, two $R^2$ groups on adjacent carbons may be taken together to form (with ring carbons to which they are attached) one, two or more fused aromatic or alicyclic rings having from 4 to about 8 ring members per ring. For example, two $R^2$ groups can be taken together to form (together with the phenol depicted in the above formula) a naphthyl or acenaphthyl ring. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in the formula above, the hydroxyl group of units 3) may be either at the ortho, meta or para positions throughout the copolymer. Para or meta substitution is generally preferred.

Each $R^3$, $R^4$ and $R^5$ substituent independently may be hydrogen or substituted or unsubstituted alkyl preferably having 1 to about 8 carbon atoms, more typically 1 to about 6 carbons, or more preferably 1 to about 3 carbons.

The above-mentioned substituted groups (i.e. substituted groups R and $R^1$ through $R^5$ of the formula above) may be substituted at one or more available positions by one or more suitable groups such as halogen (particularly F, Cl or Br); $C_{1-8}$ alkyl; $C_{1-8}$ alkoxy; $C_{2-8}$ alkenyl; $C_{2-8}$ alkynyl; aryl such as phenyl; alkanoyl such as a $C_{1-6}$ alkanoyl of acyl and the like; etc.

Typically a substituted moiety is substituted at one, two or three available positions.

Other resin systems may be employed in a photoresist employed in accordance with the invention. For instance, resins can be employed that contain repeat units that comprise an acetal or ketal moiety that will react with photogenerated acid, and optionally aromatic repeat units such as phenyl or phenolic groups, such as polymers as described in U.S. Pat. Nos. 5,929,176 and 6,090,526, both incorporated herein by reference.

The resin component may be present as a sole resin component, or as a component of a blend of resins. The resin component of a resist composition of the invention should be present in an amount sufficient to providing acceptable film-forming characteristics. See the example which follows for preferred amounts of a resin component.

Some specifically preferred polymers for use in resists of the invention are set forth in the following Table 1 and numbered sequentially as polymers 1 through 45. In some instances, molar amounts (based on total units of the polymer) of the respective repeat units as depicted left to right are set forth below the polymer number

TABLE 1

| Polymer number and repeat units molar amount | Polymer structure |
| --- | --- |
| 1<br>60/20/20 | |
| 2<br>65/35 | |
| 3<br>65/20/15 | |
| 4<br>75/15/10<br>74/19/7<br>77/16/7 | |
| 5<br>75/15/10 | |

TABLE 1-continued
| Polymer number and repeat units molar amount | Polymer structure |
|---|---|
| 6<br>10/70/20 | 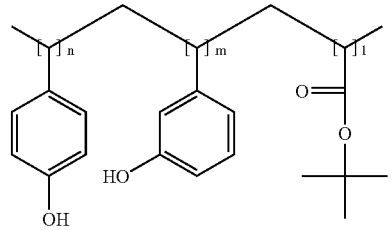 |
| 7<br>10/70/20 | 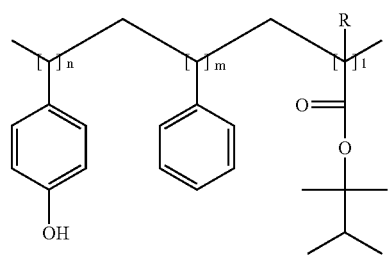<br>R = H, Me |
| 8<br>10/70/20 | 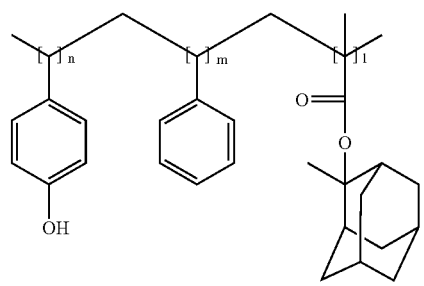 |
| 9<br>10/70/20 | 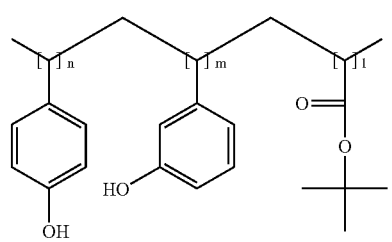 |
| 10<br>10/70/20 | 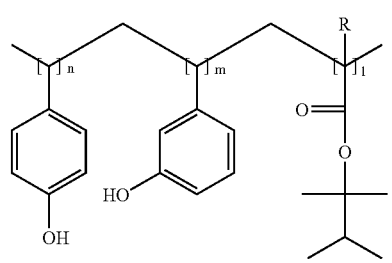<br>R = H, Me |

TABLE 1-continued
Polymer number and repeat units molar amount | Polymer structure
11
10/70/20
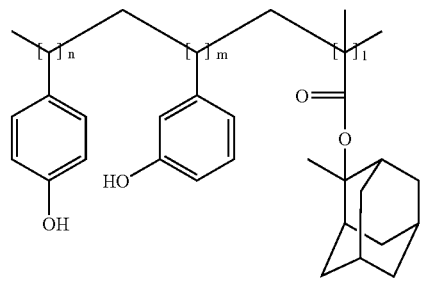
12
10/70/20
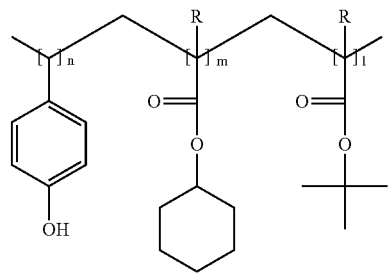
R = H, Me
13
10/70/20
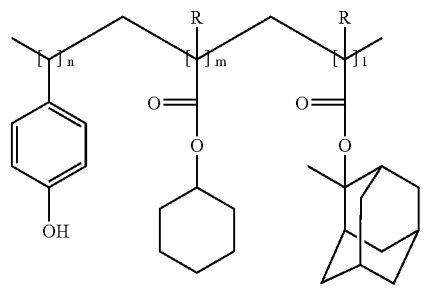
R = H, Me
14
10/70/20
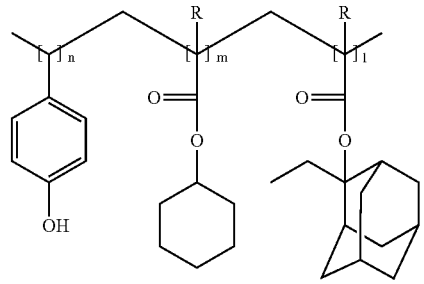
R = H, Me TABLE 1-continued

| Polymer number and repeat units molar amount | Polymer structure |
|---|---|
| 15 | (structure: copolymer of 4-hydroxystyrene and 4-(tert-butoxycarbonyloxy)styrene) |
| 16 | (structure: copolymer of 4-hydroxystyrene and tert-butyl acrylate/methacrylate) |
| 17 | (structure: terpolymer of 4-hydroxystyrene, styrene, and tert-butyl acrylate/methacrylate) |
| 18 | (structure: terpolymer of 4-hydroxystyrene, 3-hydroxystyrene, and tert-butyl acrylate/methacrylate) |
| 19 | (structure: terpolymer of 4-hydroxystyrene, styrene, and 2-phenyl-2-propyl acrylate/methacrylate) |

TABLE 1-continued

| Polymer number and repeat units molar amount | Polymer structure |
| --- | --- |
| 20 | (structure: copolymer with two aromatic repeat units — one bearing p-OH, the other bearing O-CH(CH₃)-O-isobutyl acetal) |
| 21 | (structure: terpolymer with three aromatic repeat units — p-OH phenyl, phenyl-O-C(=O)-O-tBu (t-Boc carbonate), and phenyl-O-CH(CH₃)-O-ethyl acetal) |
| 22 | (structure: terpolymer with p-hydroxyphenyl, phenyl, and p-(1-ethoxyethoxy)phenyl repeat units) |
| 23 | (structure: terpolymer with p-hydroxyphenyl, phenyl, and p-(1-ethoxyethoxy)phenyl repeat units) |

TABLE 1-continued
| Polymer number and repeat units molar amount | Polymer structure |
| --- | --- |
| 24 10/70/20 | 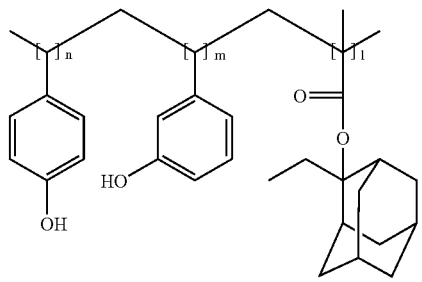 |
| 25 10/70/20 | 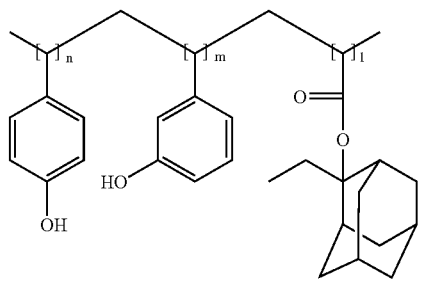 |
| 26 75/15/10 | 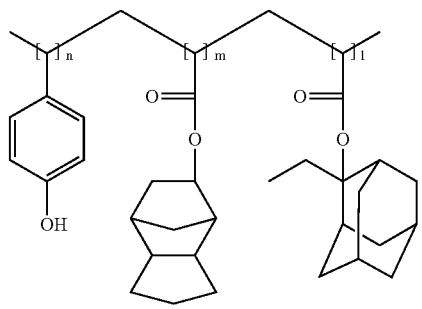 |
| 27 75/15/10 | 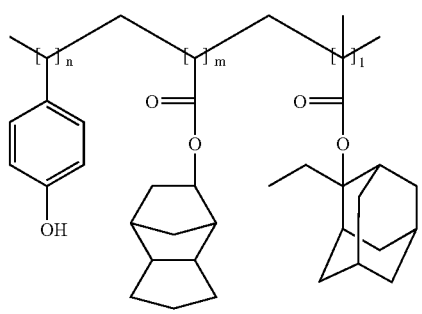 |
| 28 60/15/25 | 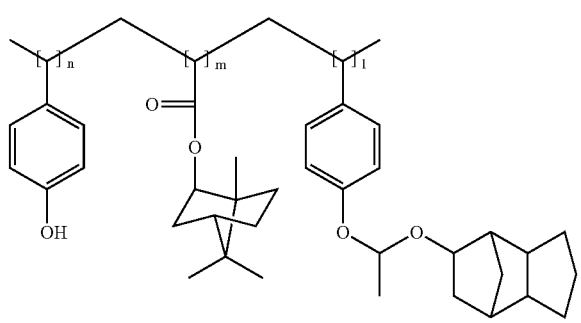 |

TABLE 1-continued
| Polymer number and repeat units molar amount | Polymer structure |
| --- | --- |
| 29<br>60/15/25 | 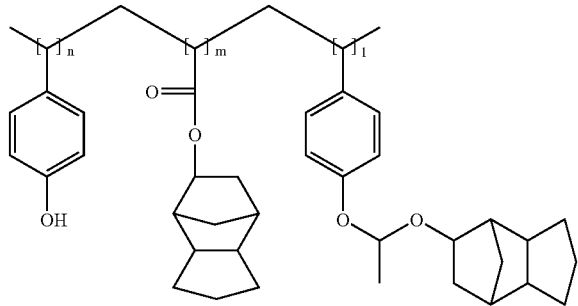 |
| 30<br>60/15/25 | 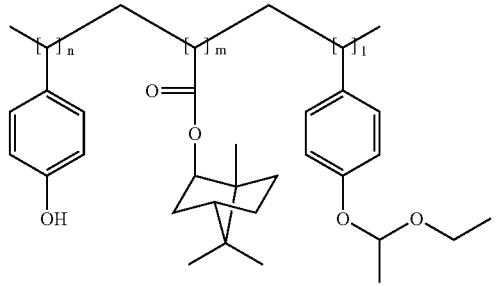 |
| 31<br>60/40, 70/30 | 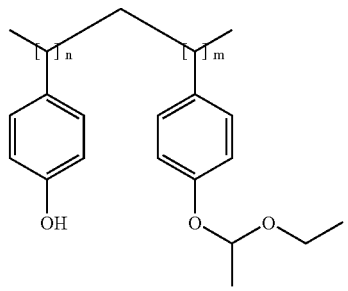 |
| 32<br>60/40, 50/50 | 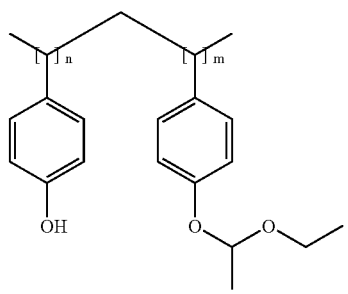 |
| 33<br>65/35, 60/40 | 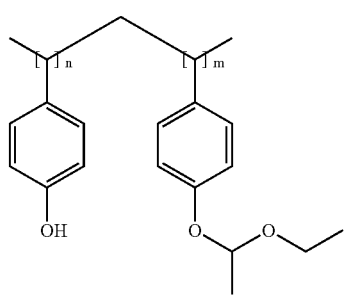 |

TABLE 1-continued
| Polymer number and repeat units molar amount | Polymer structure |
| --- | --- |
| 34<br>65/35, 60/40 | 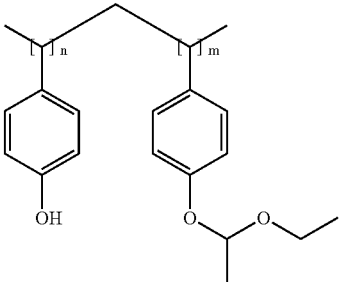 |
| 35<br>65/35, 60/40 | 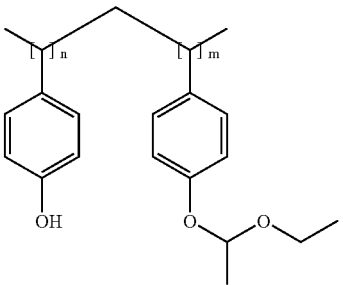 |
| 36<br>50/50, 60/40, 70/30 | 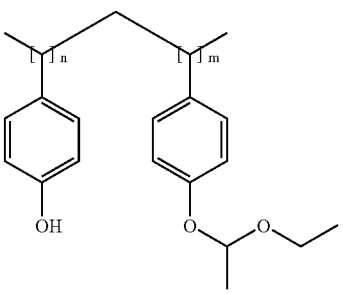 |
| 37 | 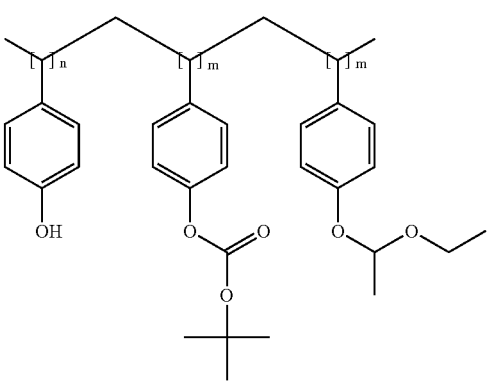 |

TABLE 1-continued

| Polymer number and repeat units molar amount | Polymer structure |
|---|---|
| 38<br>65/15/20<br>70/15/15 | |
| 39<br>60/15/25<br>72/14/14 | |
| 40<br>55/15/30 | |
| 41 | |

TABLE 1-continued
| Polymer number and repeat units molar amount | Polymer structure |
| --- | --- |
| 42 | 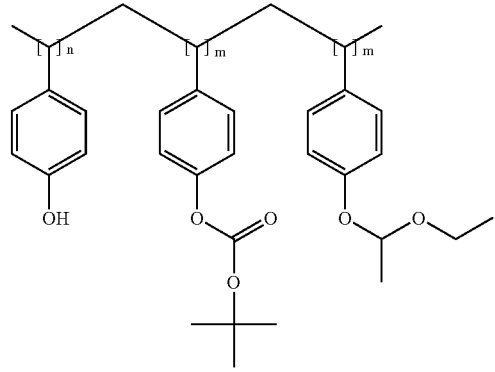 |
| 43 | 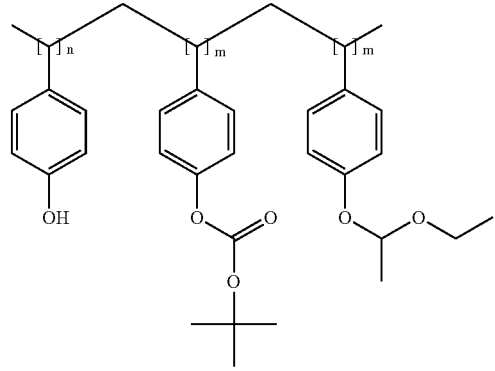 |
| 44<br>69/6/25 | 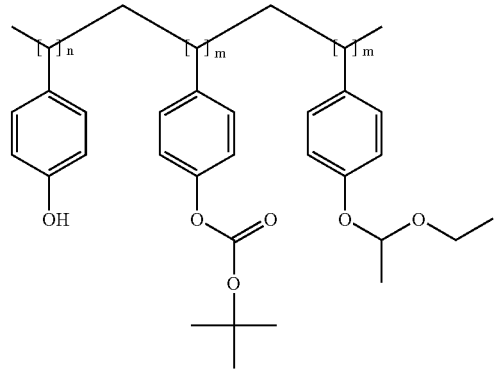 |
| 45<br>64/7/29 | 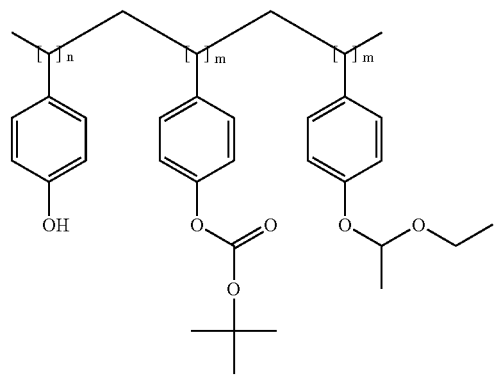 |

Preferred monomers for synthesis of resist polymers of the invention include the corresponding vinyl compounds of the repeat units shown in Table 1 above. Preferred monomers for synthesis of resist polymers of the invention also include isobornylacrylate, isobornylmethacrylate, methylmethacrylate, methylacrylate, acrylnitrile, methacrylonitrile, vinylidine fluiride, tetrafluoroethylene (TFE), and groups contains hexafluorpropylalcohol.

Preferred moieties of polymers and monomers used to synthesize polymers used in resists of the invention include isobornyl, hexafluoropropylalcohol ($CF_3$—$CH(OH)$—$CF_3$) and other fluoro-containing groups, nitrile, lactone, and anhydrides as well as the groups discussed above.

As discussed above, an imaged photoresist coating layer may be coated in order to minimize undesired outgassing of resist material. For example, the imaged coating (typically the resist layer also has been developed) may be treated to provide a outer coating layer to encapsulate materials that could outgas during subsequent ion implantation processing. A preferred approach is treatment of the developed resist image with a material that will preferably react and/or adhere to the resist image rather than the substrate areas bared upon development. For instance, the developed resist image can be treated with a solyl reagent such as trimethylsilyl chloride or other silyl reagent. Exemplary silyl reagents are disclosed in U.S. Pat. No. 5,427,649. Preferably, the resist contains functionality that will react with the silyl reagent, such as hydrocy groups as may be present on a phenolic resin or other resist component.

As discussed above, photoresists of the invention comprise a photoactive component, typically one or more photoacid generator compound. Preferred resists do not contain a diazonaphthoquinone compound (PAC).

Particularly preferred PAGs for use in resists of the invention include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones and disulfonehydrazines, nitrobenzyl compounds, halogenated particularly fluorinated non-ionic PAGS.

Also, as discussed above, particularly for thick film resist aspects of the invention, preferred are PAGs that do not contain aromatic substitution.

More specifically, preferred iodonium PAGs include those of the following Formula 1:

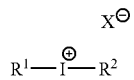

wherein in Formula I, $R^1$ and $R^2$ are each independently optionally substituted alkyl such as $C_{1-20}$alkyl including alicyclics such as cyclohexyl, adamantly, isobornyl, norbomyl, fenchyl, dodecanyl, and the like; optionally substituted carbocyclic aryl such as phenyl, naphthyl and the like; and optionally substituted heteroaromatic or heteroalicyclic such as groups having 1 to 3 separate or fused rings and 1-3 hetero atoms (N, O or S) as ring members; and X is a counter anion such as a carboxylate or sulfonate counter anion, preferably a a sulfonate (—$SO_3$) or carboxylate(—$COO^-$) substituted with one or more moieties such as optionally substituted alkyl preferably $C_{1-20}$alkyl, particularly $C_{1-10}$alkyl substituted with one or more electron-withdrawing groups e.g. F or other halo, nitro, cyano, etc., with perfluoruoalkyl, particularly $C_{1-10}$perfluoroalkyl being preferred; optionally substituted carbocyclic aryl such as phenyl or naphthyl; optionally substituted heteroaromatic or heteroalicyclic such as groups having 1 to 3 separate or fused rings and 1-3 hetero atoms (N, O or S) as ring members.

Preferred imidosulfonate PAGs include compounds of the following Formula II:

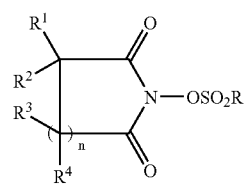

wherein in Formula II, R is suitably by optionally substituted alkyl preferably $C_{1-20}$alkyl, particularly $C_{1-10}$-alkyl substituted with one or more electron-withdrawing groups e.g. F or other halo, nitro, cyano, etc., with perfluoruoalkyl, particularly $C_{1-10}$perfluoroalkyl being preferred; optionally substituted carbocyclic aryl such as phenyl or naphthyl; optionally substituted heteroaromatic or heteroalicyclic such as groups having 1 to 3 separate or fused rings and 1-3 hetero atoms (N, O or S) as ring members;

$R^1$, $R^2$, $R^3$ and $R^4$ each independently being hydrogen or a group as defined for R, or where $R^2$ and $R^3$ are taken together and/or $R^1$ and $R^4$ are taken together to form a ring, preferably an alicyclic ring, e.g. having from 4 to about 8 ring members; and n is 1, 2; 3 or 4, preferably 1 or 2.

Preferred PAGs of Formula II include those with a fused alicyclic ring structure, such as PAGs of the following Formula IIa:

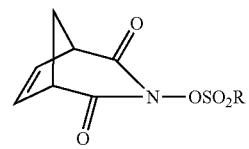

wherein in Formula IIa, R is the same as defined in Formula II above, and preferably R is fluorinated $C_{1-12}$alkyl, particularly perfluoro$C_{1-12}$alkyl such as —$CF_3$.

Sulfonium PAGS also will be suitable for use in resists of the invention. For instance, preferred sulfonium PAGs include compounds of the following Formula III:

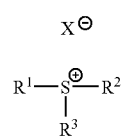

wherein $R^1$, $R^2$ and $R^3$ are each independently selected from the same group as defined for $R^1$ and $R^2$ in Formula I above; and X is the same as defined for Formula I above.

Also preferred are ring sulfonium PAGs such as those of the following Formula IV:

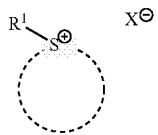

IV wherein $R^1$ and X are the same as defined in Formula III above; the dotted lines designate a ring structure that includes the depicted sulfur cation as a ring member, the ring suitably having 5 to about 8 ring members, and one, two or more endocyclic multiple bonds, and one or more optional ring substituents. Preferably the dotted lines form a non-aromatic ring, such as thienyl, or a completely saturated ring (no endocyclic double bonds).

In the above Formulae I, III and IV, preferred counter anions X are perfluoroalkyl and perfluoroalkoxy groups such as $C_{1-15}$perfluoroalkyl and $C_{1-15}$perfluoroalkoxy, e.g. triflate, perfluorobutanesulfonate, perfluorohexanesulfonate, perfluoroctanesulfonate, and perfluoroethoxyethylsulfonate.

A variety of other PAGs may be used in resists of the invention, including non-ionic PAGs such as substituted disulfone compounds; sulfonate compounds including N-oxyimino sulfonate compounds, α-cyano N-oxyimino sulfonate compounds; sidulfone hydrazine compounds; diazomethanedisulfone compounds; nitrobenzyl compounds; substituted acylsulfonium compounds; and oxime sulfonate compounds including bis-N-oxyimidosulfonate compounds.

More particularly, preferred disulfone PAGs for use in resists of the invention include compounds of the following Formula V:

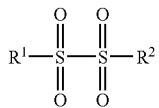

V wherein $R^1$ and $R^2$ are the same as defined for Formula I above.

Preferred oxime sulfonate PAGs for use in resists of the invention include those of the following Formula VI:

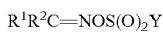

$R^1R^2C=NOS(O)_2Y$

VI wherein $R^1$ and $R^2$ may be the same as defined above for Formula I, and/or where at least one of $R^1$ and $R^2$ is an electron-withdrawing moiety such as cyano, nitro, haloalkyl particularly $C_{1-12}$ haloalkyl especially $C_{1-12}$perfluoroalkyl such as —$CF_3$, —$CF_2CF_3$ and other perfluoroalkyl, alkanoyl, and the like;

Y is a non-hydrogen substituent and is suitably the same as defined for R in Formula II above.

Preferred diazosulfone PAGS for use in resists of the invention include those of the following Formula VII:

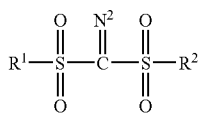

VII wherein $R^1$ and $R^2$ are the same as defined in Formula I above.

Preferred α,α-methylenedisulfone PAGs for use in resists of the invention include those of the following Formula VIII:

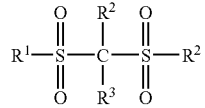

VIII wherein $R^1$ and $R^2$ are the same or different and are other than hydrogen and are suitably the same as defined above in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

As mentioned above, disulfonehydrazine PAGS (i.e. hydrazine moiety interposed between the two sulfone moieties) also are suitable, preferably where the hydrazine moiety (e.g. $N(R^3)$—$N(R^4)$— of Formula IX below) interposed between the two sulfone moieties is mono- or di-substituted with non-hydrogen substituents. Preferred disulfonehydrazine PAGS for use in resits of the invention include compounds of the following Formula IX:

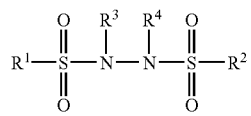

IX wherein $R^1$ and $R^Z$ are the same or different and are other than hydrogen, and suitably are the same as defined in Formula I;

$R^3$ and $R^4$ are the same or different and may be hydrogen or a non-hydrogen substituent such as defined for $R^1$ in Formula I above, and preferably at least one of $R^3$ and $R^4$ is other than hydrogen, more preferably both $R^3$ and $R^4$ are other than hydrogen.

Further suitable PAGs for use in resists of the invention include disulfonylamine (i.e. —$SO_2$—N—$SO_2$—) salts, such as compounds of the following Formula X:

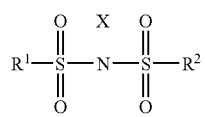

X wherein $R^1$ and $R^2$ are the same or different and are other than hydrogen, and suitably are the same as defined in Formula 1; and X is a counter ion.

One or more PAGS should be employed in a resist in an amount sufficient to provide a developable image upon exposure to activating radiation, such as 248 nm radiation. Suitably one or more PAGs are employed in an amount of 1 to 15 weight percent based on total solids of the resist (i.e. all components except solvent), more typically about 2 to 12 weight percent of total solids.

PAGs for use in resists of the invention can be made by generally known procedures. For instance, see U.S. Pat.

Nos. 4,442,197 and 4,642,912 and European Application 0708368A1 for synthesis of iodonium PAGs. See WO 94/10608 for synthesis of N-sulfonyloxyimide PAGs. Diazosulfone PAGs can be made, e.g., by procedures disclosed in European Patent Application 0708368A1 and U.S. Pat. No. 5,558,976. See also WO 00/10056.

Preferred PAGs of the invention generate relatively large photoacids to inhibit undesired diffusion of the photoacid into unexposed of the thick resist layer. For example, preferred photoacids may have a volume of at least about 155 or 160 Å$^3$, more preferably a volume of at least 170, 180 or 190 Å$^3$. Even larger photoacids will be suitable, including photoacids having a volume of at least about 200, 220, 250, 280 or 300 Å$^3$. Such large photoacids will be less prone to undesired diffusion through a thick resist coating layer.

References herein to sizes of photoacids designate volumetric size as determined by standard computer modeling, which provides optimized chemical bond lengths and angles. A preferred computer program for determining photoacid size is Alchemy 2000, available from Tripos. For a further discussion of computer-based determination of photoacid size, see T. Omte et al., Polymers for Advanced Technologies, "Photoreactive Fluorinated Polyimide Protected by a Tetrahydropyranyl Group Based on Photoinduced Acidolysis", volume 4, pages 277-287.

Exemplary preferred large photoacids include the following, with volumetric size values (Å$^3$) listed immediately below the acid.

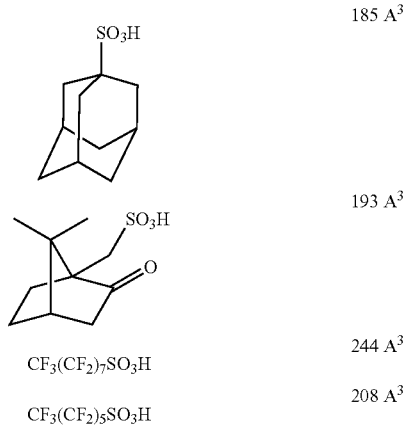

185 Å$^3$

193 Å$^3$

CF$_3$(CF$_2$)$_7$SO$_3$H     244 Å$^3$

CF$_3$(CF$_2$)$_5$SO$_3$H     208 Å$^3$

As discussed above, it should be appreciated that preferred resists of the invention are distinguished from resists that contain a so-called photoactive compound (PAC) rather than a photacid generator. Typical PACs are diazonaphthoquinones and function as dissolution inhibitors rather than an acid that promotes a deblocking reaction. Such PAC-containing resists are imaged with radiation of relatively long wavelengths such as I-line (365 nm).

As discussed above, preferred resists of the invention may contain an acid generator compound, particularly a thermal acid generator that is activated only during a post-development bake, but not during other lithographic processing such as pre-exposure soft-bake and/or post-exposure bake. A variety of the thermal acid generator compounds may be employed such as ionic or substantially neutral thermal acid generators, e.g. an ammonium arenesulfonate salt. Typically one or more thermal acid generators are present in a resin composition in a concentration from about 0.1 to 10 percent by weight of the total of the dry components of the composition (all components except solvent carrier), more preferably about 2 percent by weight of the total dry components. Suitable thermal acid generator compounds are commercially available such as the Nacure products available from King Industries (Norwalk, Conn.).

As discussed, various moieties of resin units, PAGS, and other components of resists of the invention may be optionally substituted, typically 1, 2, or 3 positions by one or more suitable groups such as e.g. halogen (particularly F, Cl or Br); C$_{1-8}$ alkyl; C$_{1-8}$ alkoxy; C$_{2-8}$ alkenyl; C$_{2-8}$ alkynyl; hydroxyl; alkanoyl such as a C$_{1-6}$ alkanoyl e.g. acyl; carbocyclic aryl such as phenyl; and the like, although multiple carbon-carbon bonds and aromatic groups will be less preferred due to excessive absorbance of exposure radiation.

Preferred substituent groups of substituted groups of resins, PAGs, plasticizers, and other components of resists of the invention include or consist of at least one halogen atom, preferably fluorine such as fluorinated C$_{1-12}$alkyl, perfluoroC$_{1-12}$alkyl, and perfluoroC$_{1-12}$alkylene, fluorinated C$_{3-8}$cycloalkyi, and fluorinated ethers (including C$_{1-12}$ alkoxy) and esters (including C$_{1-12}$ esters) including fluorinated cyclic ethers and fluorinated cyclic esters.

As used herein, the term alkyl, alkynyl and alkynyl unless otherwise modified refers to linear, branched and cyclic groups, although of course cyclic groups will comprise at least three carbon ring members. Alkoxy groups of resist components suitably have 1 to about 16 carbons and 1, 2, 3 or 4 alkoxy linkages. Suitable alkanoyl groups have 1 to about 16 carbons and one or more carbonyl groups, typically 1, 2 or 3 carbonyl groups. Carbocyclic aryl as used herein refers to non-hetero aromatic groups that have 1 to 3 separate or fused rings and 6 to about 18 carbon ring members and may include phenyl, naphthyl, biphenyl, acenaphthyl, phenanthracyl and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrimdinyl, furyl, pyrrolyl, thienyl, thiazolyl, oxazolyl, imidazolyl, indolyl, benzofuranyl and benzothiazole.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate; 2-heptanone and cyclohexanone. Typically, the solids content of the composition varies between about 5 and 35 percent by weight of the total weight of the photoresist composition. The resin binder and, photoactive components should be present in amounts sufficient to provide a film coating layer and formation of good quality latent and relief images. See the example which follows for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

The resists and methods of the invention are particularly use in e.g. the manufacture of thin film heads (e.g. 3 to 5 μm), magnetic disks, CD masks, and back-end implants.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent-upon the exposure tool and the components of the photoresist composition.

As discussed above, coating layers of the resist compositions of the invention are preferably photoactivated by a short exposure wavelength, particularly a sub-300 and sub-200 nm such as 248 nm 193 nm and 157 nm. 248 nm imaging is particularly preferred.

Following exposure, the film layer of the composition is preferably baked under relatively mild conditions, particularly a post-exposure bake of about 110° C.

The post-exposure bake also is relatively short in duration, e.g. the imaged coating is heated under such mild conditions for no more than about 3 minutes, more preferably no more than about 2, 1.5, 1, 0.75 or 0.5 minutes.

After the post-exposure bake, the resist layer may be developed to provide a relief image, e.g. by treating the coating layer with an aqueous alkaline solution such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. Plasma development also may be employed. In general, development is in accordance with procedures recognized in the art.

Following development, the photoresist may be thermally treated to remove any potential volatile groups, particularly by thermal treatment at temperatures in excess of the pre-exposure or post-exposure bakes. While such post-development may be dictated by the activation temperature of a thermal acid generator of the resist, suitable post-development treatment include heating to about 150° C. or 160° C. for 1 or 2 minutes.

After development and any post-development thermal cure, an ion implant process may be conducted, e.g. by bombardment of the substrate with resist relief image with one or more dopant ions such as argon, boron, boron fluoride, arsenic, phosphorus and/or nitrogen, with arsenic, phosphorus and/or boron being more typically employed. The ion implanting is preferably conducted under high energy conditions, e.g. 20 eV or more, such as 40, 50, or 80 eV or more, and preferably under reduced pressure in a chamber.

Thereafter, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

As discussed above, photoresists of the invention are particularly useful to form metal bumps on a semiconductor wafer. Such processing can include: a) disposing on a semiconductor wafer a photoresist of the invention, preferably to provide a thick film coating layer such as a dried resist coating layer of 50 μm or greater; c) imagewise exposing the layer of photosensitive composition to actinic radiation, including sub-300 nm radiation particularly 248 nm ; d) developing the exposed layer of photosensitive composition to provide patterned areas; e) depositing a metal into the patterned areas; and f) removing the exposed photosensitive composition to provide a semiconductor wafer having metal bumps.

In such bump-forming methods, the photoresist layer is imaged so as to form apertures such as vias in the photosensitive layer. In such process, the photosensitive layer is disposed on a conductive layer on the electronic device. Exposure of the photosensitive composition and subsequent development provides defined holes (vias) in the photosensitive composition and exposes the underlying conductive layer. Accordingly, the next step of the process is to deposit metal or metal alloy bumps with the defined holes (vias). Such metal deposition may be by electroless or electrolytic deposition processes. Electrolytic metal deposition is preferred. In an electrolytic metal deposition process, the electronic device substrate, i.e. semiconductor wafer, functions as the cathode.

Prior to deposition of a metal or metal alloy, such as that suitable as a solder, a conductive layer such as copper or nickel may be deposited by sputtering, electroless deposition and the like, to form the under-bump-metal. Such under-bump-metal layer is typically from 1000 to 50,000 Å in thickness and acts as a wettable foundation to the subsequently plated solder bump.

A wide variety of metals may be deposited electrolessly, including, but not limited to, copper, tin-lead, nickel, gold, silver, palladium, and the like. Suitable metals and metal alloys that may be deposited electrolytically include, but are not limited to, copper, tin, tin-lead, nickel, gold, silver, tin-antimony, tin-copper, tin-bismuth, tin-indium, tin-silver, palladium, and the like. Such metal plating baths are well known to those skilled in the art and are readily available from a variety of sources, such as Shipley Company, Marlborough, Mass.

In one embodiment, the metal deposits on the semiconductor wafer are useful as solder bumps. Accordingly, it is preferred that the metal bumps are solderable metals and metal alloys, such as tin, tin-lead, tin-copper, tin-silver, tin-bismuth, tin-copper-bismuth, tin-copper-silver, and the like. Suitable metals and metal alloys for solder bump formation are disclosed in U.S. Pat. Nos. 5,186,383; 5,902,472; 5,990,564; 6,099,713; and 6,013,572, as well as European Patent Application No. EP 1 148 548 (Cheung et al.), all of which are hereby incorporated by reference. Exemplary metals and metal alloys include, but are not limited to: tin; tin-copper alloy having less than 2% wt copper and preferably about 0.7% wt copper; a tin-silver alloy having less than 20% wt silver and preferably from 3.5 to 10% wt silver; a tin bismuth alloy having from 5 to 25% wt bismuth and preferably about 20% wt bismuth; and a tin-silver-copper alloy having less than 5% wt silver and preferably about 3.5% wt silver, less than 2% wt copper and preferably about 0.7% wt copper, and the balance being tin. In one embodiment, the metal alloys used for solder bumps are lead-free, i.e. they contain ≦10 ppm of lead.

In general, suitable electrolytic metal plating baths are acidic and contain acid, water a soluble form of the metal or metals to be deposited and optionally one or more organic additives, such as brighteners (accelerators), carriers (suppressors), levelers, ductility enhancers, wetting agents, bath stabilizers (particularly for tin-containing baths), grain refiners and the like. The presence, type and amount of each optional component varies depending upon the particular metal plating bath used. Such metal plating baths are generally commercially available, such as from Shipley Company.

Binary alloys may be deposited from a single bath, as in the case of tin-copper, tin-bismuth, tin-silver, tin-lead and the like, or may be deposited as individual layers from multiple plating baths and reflowed to form and alloy. Such reflow technique is described in U.S. Pat. No. 6,013,572. Such reflow is typically performed after removal of the remaining photosensitive composition.

In such a process, the resist composition functions as a protective layer to areas that are not to be plated. Following metal deposition, the remaining resist composition is stripped, such as by using a commercially available N-methylpyrrolidone ("NMP") based stripper at a temperature of about 40° to 69° C. Suitable strippers are available from a variety of sources, such as Shipley-SVC, Sunnyvale, Calif.

All documents mentioned herein are incorporated herein by reference. The following non-limiting example is illustrative of the invention.

EXAMPLE 1

Resist Preparation and Processing with Comparative Results

A resist (referred to below as "Resist 1") is prepared by admixing the following components where amounts are expressed as weight percent of total weight of the resist.

| Component | Amount |
| --- | --- |
| Resin. | 26.80 |
| PAG | 0.53 |
| Basic Additive | 0.034 |
| Leveling agent | 0.027 |
| Ethyl lactate solvent | 72.57 |

In Resist 1, the resin is Polymer 1 as depicted in Table 1 above; the PAG is a di-(4-t-butylphenyl)iodonium-trifluoromethylbenzenesulfonate; the basic additive is tetrabutylammonium lactate; the leveling agent is FC-430 (available from 3M). As shown above, Resist 1 is formulated at 27.4 percent solids.

The formulated Resist 1 is filtered through a 0.2 micrometer Teflon filter and spin coated onto 8 inch silicon wafers (pre-treated with hexamethylenedisiloxane at 120° C. for 30 seconds) on a TEL Mark 8 track (from Tokyo Electron Limited) to a thickness of about 3.0 micrometer (3000 angstroms) and baked at 130° C. for 60 seconds. The coated wafers are exposed on an GCA XLS 7800 deep UV stepper equipped with a KrF laser (248 nm) for a lines/spaces test pattern using 0.53 NA and 0.74 σstepper settings, followed by post exposure bake at 100° C. (130° C. for comparison samples) for 90 seconds and development with an aqueous alkaline developer.

EXAMPLE 2

Further Photoresist Preparation and Processing

Forty-four additional photoresists are prepared having the same components and amounts thereof as Resist 1 of Example 1 above, except a different resin (Polymers 2 through 45) from Table 1 is used in each of the additional forty-four resists in place of the resist polymer of Example 1.

These additional photoresists can be coated, exposed and developed as described in Example 1 above.

EXAMPLE 3

Further Photoresist Preparation and Processing

A photoresist composition is prepared by admixing by admixing the following components in the specified amounts: a first polymer that is a terpolymer of polymerized units of para-hydroxystyrene/methylmethacrylate/t-butylacrylate in respective molar amounts of 55/30/15 (charge ratio); a second polymer of polymerized units of para-hydroxystyrene/t-butylacrylate in respective molar amounts of 65/35 (charge ratio), with the weight ratio of first polymer:second polymer being 40/60; a first photoacid generator compound of di-(4-t-butylphenyl)iodonium-trifluoromethylbenzenesulfonate in an amount of 1.2 weight percent of the polymer component; a second photoacid generator compound of di-(4-t-butylphenyl)iodonium-perfluorobutylsulfonate in an amount of 0.8 weight percent of the polymer component; a basic additive of tetramethylammonium lactate; a leveling agent of FC-430; and a solvent component that contains ethyl lactate.

This photoresist composition is spin-coated onto 8 inch silicon microelectronic wafers to a thickness of about 3.5 micrometer (3500 angstroms) and baked at 130° C. for 60 seconds. The coated wafers are exposed on a deep UV scanner equipped with a KrF laser (248 nm) for a lines/spaces test pattern, followed by post exposure bake at 110° C. for 90 seconds and development with an aqueous alkaline developer.

After formation of the photoresist relief image, the substrate (with resist mask) is exposed to high energy (>20 eV, reduced pressure environment) phosphorus-ion implant processing.

This photoresist exhibited reduced outgassing during ion implant processing relative to comparable photoresists that contained only a single polymer of a para-hydroxystyrene/t-butylacrylate copolymer.

EXAMPLE 4

Further Photoresist Preparation and Processing

A photoresist composition is prepared by admixing by admixing the following components in the specified amounts: a first polymer that is a terpolymer of polymerized units of para-hydroxystyrene/styrene/t-butylacrylate in respective molar amounts of 60/20/20 (charge ratio); a second polymer of polymerized units of para-hydroxystyrene/styrene in respective molar amounts of 80/20 (charge ratio), with the weight ratio of first polymer:second polymer being 50/50; a first photoacid generator compound of di-(4-t-butylphenyl)iodonium-trifluoromethylbenzenesulfonate in an amount of 1.2 weight percent of the polymer component; a second photoacid generator compound of di-(4-t-butylphenyl)iodonium-perfluorobutylsulfonate in an amount of 0.8 weight percent of the polymer component; a basic additive of tetramethylammonium lactate; a leveling agent of FC-430; and a solvent component that contains ethyl lactate.

This photoresist composition is spin-coated onto 8 inch silicon microelectronic wafers to a thickness of about 3.5 micrometer (3500 angstroms) and baked at 130° C. for 60 seconds. The coated wafers are exposed on a deep UV scanner equipped with a KrF laser (248 nm) for a lines/spaces test pattern, followed by post exposure bake at 120° C. for 90 seconds and development with an aqueous alkaline developer.

After formation of the photoresist relief image, the substrate (with resist mask) is exposed to high energy (>20 eV reduced pressure environment) boron-ion implant processing.

This photoresist exhibited reduced outgassing during ion implant processing relative to comparable photoresists that contained only a single polymer of a para-hydroxystyrene/t-butylacrylate copolymer.

Although preferred embodiments of the invention have been described using specific terms, such description is for illustrative purposes only, and it is understood that changes and variations can be made without departing from the spirit or scope of the following claims.

What is claimed is:

1. A method for providing an ion-implanted semiconductor substrate comprising:
    providing a semiconductor substrate having coated thereon a relief image of chemically-amplified positive-acting photoresist composition,
    wherein the photoresist comprises a resin that comprises, prior to photoactivation, photoacid-labile moieties that are spaced by at least 2 atoms from the resin backbone; and
    applying dopant ions to the substrate.

2. The method of claim 1 wherein the photoresist composition has been applied to the wafer, exposed to patterned radiation having a wavelength of 248 nm, and developed to provide the relief image.

3. The method of claim 2 wherein the photoresist comprises a resin that comprises, prior to photoactivation, photoacid-labile moieties that are spaced by at least 3 atoms from the resin backbone.

4. The method of claim 2 wherein he photoresist comprises a resin that comprises, prior to photoactivation, photoacid-labile moieties that are spaced by at least 4 atoms from the resin backbone.

5. The method of claim 2 wherein he photoresist comprises a resin that comprises, prior to photoactivation, photoacid-labile moieties that are spaced by at least 6 atoms from the resin backbone.

6. The method of claim 2 wherein the dopant ions are boron, arsenic or phosphorus ions.

* * * * *